United States Patent

[11] 3,569,953

[72] Inventors Donald G. Shuda
Clarence Center;
Donald L. Starkey, North Tonawanda, N.Y.
[21] Appl. No. 715,625
[22] Filed Mar. 25, 1968
[45] Patented Mar. 9, 1971
[73] Assignee Sylvania Electric Products Inc.

[54] WIDE RANGE ANALOG TO DIGITAL CONVERTER
9 Claims, 1 Drawing Fig.

[52] U.S. Cl. .......... 340/347
[51] Int. Cl. .......... H03k 13/02
[50] Field of Search .......... 340/347

[56] References Cited
UNITED STATES PATENTS

| | | | |
|---|---|---|---|
| 3,041,469 | 6/1962 | Ross | 340/347 |
| 3,142,056 | 7/1964 | Martin | 340/347 |
| 3,277,463 | 10/1966 | Rosenberg | 340/347 |
| 3,426,296 | 2/1969 | Christiansen | 340/347 |
| 3,444,550 | 5/1969 | Paulis | 340/347 |
| 3,447,147 | 5/1969 | Deregnaucourt | 340/347 |
| 3,351,930 | 11/1967 | Zweig | 340/347 |

*Primary Examiner*—Maynard R. Wilbur
*Assistant Examiner*—Jeremiah Glassman
*Attorneys*—Norman J. O'Malley, Elmer J. Nealon and Edward J. Coleman ABSTRACT: An analog to digital converter for logarithmically quantizing an analog input voltage, which may vary over a wide dynamic range, and providing a representative binary-coded decimal readout. The analog input voltage is processed through parallel strings of serially connected logarithmic amplifiers, the individual outputs of which are connected to respective threshold detectors at the parallel inputs of a shift register. Upon command, shift pulses are applied to the register to generate a serial output which is applied to a binary counter for readout.

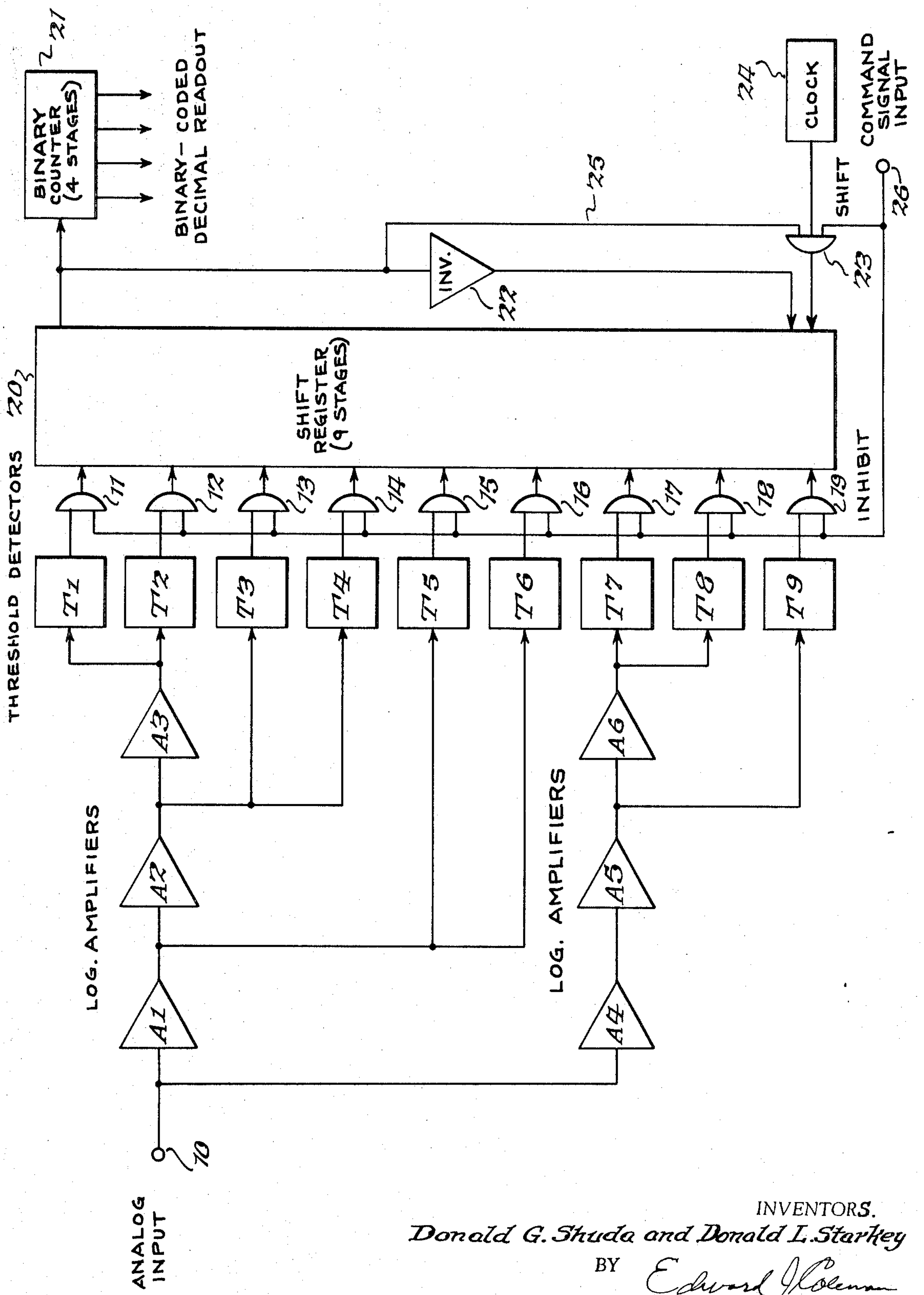
INVENTORS.
Donald G. Shuda and Donald L. Starkey
BY Edward J. Coleman
AGENT.

WIDE RANGE ANALOG TO DIGITAL CONVERTER

BACKGROUND OF THE INVENTION

This invention relates generally to analogue to digital converters, and in particular to circuitry for translating an analogue input signal subject to amplitude variations over a wide dynamic range into a binary-coded digital output signal representing a logarithmic quantization of the input signal level.

Analogue to digital converters are useful in a number of applications; for example, the capabilities of digital computers can be extended using these circuits as input or output devices, and use at the output of a measuring device provides a readout in convenient digital format. The circuit design of analogue to digital converters has taken a variety of forms, most of which, however, are quite complicated and costly. The general approach is to employ a logical matrix keyed by a digital timer in such a manner that the incoming analogue signals are compared with a standard voltage successively of diminishing value until any difference in error voltage fails to a predetermined minimum level. The number and type of comparisons form a digital code representative of the analogue value. A typical implementation includes an error amplifier for comparing the analogue voltage with the output of a standard voltage generator having a stepped output to produce digital code signals corresponding to the successive comparison operations required until equality is reached between the analogue voltage and a fractional output of the standard voltage generator. These previous analogue to digital circuit designs are adequate for many applications, but are disadvantageous for others in that they exhibit rather limited dynamic range, normally much less than 100 db, and a relatively slow speed of operation.

SUMMARY OF THE INVENTION

The present invention overcomes the aforementioned disadvantages by providing in a considerably simplified circuit configuration an analogue to digital converter having improved speed of operation and a dynamic range capability of over 120 db. These objects are obtained by applying the analogue input signal in parallel to strings of serially connected logarithmic amplifiers. The outputs of a plurality of the amplifiers in each strong are respectively connected to one or more threshold detectors coupled to the parallel inputs of a shift register. The number and settings of the threshold detectors and the gain and dynamic range of each of the amplifiers are selected to provide the desired logarithmic quantization of the input signal level.

Each threshold detector is operative when triggered to load a ONE into the corresponding shift register stage. Upon command, the threshold detector outputs are inhibited and shift pulses are applied to the register. As each ONE is shifted out of the register, a pulse is applied to actuate a binary counter adapted for providing a binary-coded decimal readout. The first register stage is connected to the last stage of the register through an inverter, and the detection of a ZERO in the first stage inhibits further shifting. Thus, the shift register functions as a parallel to serial converter to actuate a digital readout from the counter which represents the peak signal level at the converter input during the time interval terminated by the command signal.

The use of parallel strings of serially connected logarithmic amplifiers reduces the dynamic range required of individual components to thereby permit a large input dynamic range. Speed of operation is limited only by the speed with which the shift registers elements can be shifted. The implementation also provides the advantage of flexibility, in that quantization can be in linear or nonlinear increments of readily selectable size and the dynamic range may be extended by adding another parallel string of amplifiers with an attenuator. Further, the converter can be built using inexpensive, uncomplicated and many identical analogue and digital circuits.

BRIEF DESCRIPTION OF THE DRAWING

The invention will be more fully described in the following detailed description taken in conjunction with the accompanying drawing, the single figure of which is a block diagram of an analogue to digital converter according to the invention.

DETAILED DESCRIPTION OF THE INVENTION

Referring to the drawing, a preferred embodiment of the invention is shown for quantizing an analogue input signal into ten logarithmic increments over a 100 db. dynamic range and providing a representative binary-coded decimal readout. The requisite quantization is accomplished by processing the analogue input signal through two parallel strings of serially connected logarithmic amplifiers to a set of nine threshold detectors T1 through T9. The first amplifier string comprises logarithmic amplifiers A1, A2, and A3 serially connected in that order with the input of amplifiers A1 connected to the analogue signal input terminal 10. The output of amplifier A3 is coupled to the inputs of threshold detectors T1 and T2; the output of amplifier A2 is coupled to the inputs of threshold detectors T3 and T4; and, the output of amplifier A1 is coupled to the inputs of threshold detectors T5 and T6. The second amplifier string comprises logarithmic amplifiers A4, A5 and A6 serially connected in that order with the input of amplifier A4 also being coupled to input terminal 10. The output of amplifier A6 is coupled to the inputs of threshold detectors T7 and T8, and the output of amplifier A5 is coupled to the input of threshold detector T9.

Preferably, each of the threshold detectors comprises a regenerative bistable circuit whose state depends on the amplitude of the voltage applied at its input; that is, when the detector input voltage exceeds a present threshold level, the detector is triggered to change state and provide an output voltage indicating the threshold exceedence. A schmitt trigger circuit with a variable threshold setting is particularly suitable for this application.

In order to provide the desired ten step quantization of an input voltage dynamic range of 100 db. above a given reference level, each of the threshold detectors is arranged to have a 10 db. voltage range. That is, an input signal level at terminal 10 of less than 10 db. leaves all of the threshold detectors T1 through T9 in quiscent state; an input level at terminal 10 of +10 db. or greater causes detector T1 to be triggered and thus produce an exceedence output signal; a +20 db. input results in exceedence outputs from detectors T1 and T2; and, so the pattern proceeds to the point where an input level of +90 db. or greater causes exceedence outputs to be produced from all of the threshold detectors T1 through T9.

To accommodate this threshold detector arrangement, logarithmic amplifier A3 has a dynamic range of 20 db. so as to be capable to dynamically processing the analogue input signal for detectors T1 and T2. Logarithmic amplifier 42 has a dynamic range of 40 db. to provide signal processing for detectors T1 through T4, and amplifier A1 has a dynamic range of 60 db. to accommodate the six detectors T1 through T6. Input voltage levels about +60 db. are accommodated by the parallel string of amplifiers A4, A5, and A6. Thus, amplifier A6 has a dynamic range of 20 db. above the operating range of amplifier A1 so as to process signals for detectors T7 and T8; and amplifiers A4 and A5 each have a minimum dynamic range of 40 db. above the operating range of amplifier A1 so as to process signals for detectors T7 through T9 and, together with the first string of amplifiers, accommodate a 100 db. input signal dynamic range.

Triggering the threshold detectors in 10 db. increments is accomplished by appropriate selection of threshold settings and amplifier gains. This may be illustrated by considering the following typical selection of circuit values:

| | |
|---|---|
| 0 db. reference level | 1 microvolt |
| A1 gain | 70 db. |
| A4 gain | 10 db. |
| A2, A3, A5, A6 gain | 2 db. each |

T1, T3, T5, T7, T9 threshold setting . 1 volt each
T2, T4, T6, T8 threshold setting 3.16 volts each Using these values, amplifiers A1, A2 and A3 provide a combined gain of 110 db. Thus, if the input voltage at terminal 10 is +3.16 microvolts, i.e. +10 db. above the reference level, the resulting 1 volt output of amplifier A3 will trigger threshold detector T1. An input voltage to amplifier A1 of +20 db. above the reference will be amplified to an output of 3.16 volts output from amplifier A3 to thereby trigger detector T2. As the input signal increases, the 90 db. combined gain of amplifiers A1 and A2 will allow the thresholds of detectors T3 and T4 to be exceeded by input voltage levels of +30 db. and +40 db., respectively. Amplifier A3 is designed such that its dynamic range will limit the large input signal from amplifier A2 to a level just above that required to trigger both detector T1 and T2, thereby maintaining the exceedence signal outputs from detectors T1 and T2 when detectors T3 and T4 are triggered. In like manner, the 70 db. gain of amplifier A1 enables the detectors T5 and T6 to be triggered by voltage levels at the input of amplifier A1 of +50 db. and +60 db., respectively, and amplifier A2 limits the signal from amplifier A1 to maintain the threshold exceedence condition of detectors T3 and T4 when detectors T5 and T6 are triggered. Input voltage levels at terminal 10 which exceed +60 db. above 1 microvolt are beyond the dynamic range of the first string of amplifiers; however, amplifier A1 is designed to withstand high signal levels without distorting or loading the input of amplifier A3 and to limit the large input signals to a level just above that required to trigger detectors T1 through T6, thereby maintaining exceedence signal outputs from detectors T1 through T6.

When the input signal at terminal 10 reaches +70 db. above the reference voltage level the combined gain of the A4, A5, and A6 amplifier string (50 db.) allows the input signal to cause threshold detector T7 to be triggered. An increase to a +80 db. voltage level at the input of amplifier A4 will result in an output of 3.16 volts from amplifier A6 to thereby trigger detector T8. Finally the 30 db. combined gain of amplifiers A4 and A5 will permit the threshold of detector T9 to be exceeded by input voltages of +90 db. and higher, amplifier A6 being designed to limit the signal from amplifier A5 and to maintain the trigger levels at detectors T7 and T8.

The outputs of threshold detectors T1 through T9 are respectively coupled through a set of AND gates 11 through 19 to the input terminals of a parallel loaded shift register 20 composed of nine flip-flop stages. Shift register 20 is to function as a parallel to serial converter and thus has a single pulse output terminal which is connected to a four-stage binary ripple counter 21 adapted to provide the desired binary-coded decimal readout. Register 20 also has a circulation path including an inverter 22 connecting the output of its first stage to the input of its last stage. The shift pulse input of register 20 is coupled through an AND gate 23 to a source of clock pulses 24. In addition to the pulse input from clock 24, gate 23 has also two control inputs, one of which is connected via circuit path 25 to detect the state of the first flip-flop stage in register 20 and the second control input being connected to a command signal input terminal 26. The command signal input is also connected to a control input on each of the AND gates 11 and 12.

In the absence of a command signal, i.e. with a specified voltage level or no input applied to terminal 16, AND gates 11 through 19 are enabled and AND gate 23 is disabled. Each threshold detector is operative when triggered to generate an output voltage which causes a corresponding flip-flop stage of the shift register to be set, i.e. to be switched from a quiescent first binary state, which shall be designated ZERO, to a second binary state which shall be designated ONE. Thus, an analogue input signal level of +10 db. above the reference level will trigger detector T1 to load a ONE into the first stage of the shift register via enabled AND gate 11; and input signal level of +30 db. will trigger detector T1 through T3 to load ONES into the first three stages of the register via enabled AND gates 11 through 13, respectively; and a +90 db. to +100 db. analogue input will cause detectors T1 through T9 to load ONES into all nine stages of shift register 20. The shift register stages can only be "set" by the threshold detector output signals; the stages are cleared, or "reset" to ZERO by the shifting operation, as will be discussed further on.

Upon application of a command signal to terminal 26, AND gates 11 through 19 are disabled to thereby inhibit the output of threshold detectors T1 through T9, and gate 23 is enabled to allow shift pulses to be applied to register 20. More specifically AND gate 23 is enabled only if there is a ONE in the first stage of the shift register; detection of a ZERO in the first register stage via path 25 disables gate 23 to inhibit further shifting. Each shift pulse applied to the register when its first stage contains a ONE causes a pulse to be generated at the register output terminal. Thus as each ONE is shifted out of the register, a pulse is applied to actuate binary counter 21. Further each ONE shifted out of the first stage of the register is inverted in the circulation path via inverter 22 so that ZERO is transferred into the last register stage. The ONES are shifted out of register 20 and counted until a ZERO is shifted to the first stage, at which point the shift pulses are gated off, as mentioned above.

Hence, the analogue signal is quantized and fed into a shift register, which functions as a parallel to serial converter The number of ONES loaded into the shift register represents the peak signal level applied at terminal 10 between command signals. And, the four-stage binary counter 21 is operative in response to output pulses from the shift register to count the number of ONES the register contained at the time the command signal was applied and thereby produced a binary-coded decimal readout which represents the peak level of the analogue input signal during the interval terminated by the command signal. The following table illustrates this operation of the 10 increment analogue to digital converter for all peak input levels during intervals between command signals over a 100 db. dynamic range of the analogue signal applied at input terminal 10:

| Peak input level | Number of ONES loaded into register 20 | Binary-coded decimal readout |
|---|---|---|
| 0 db≤ x <10 db | 0 | 0000 |
| 10 db≤ x <20 db | 1 | 0001 |
| 20 db≤ x <30 db | 2 | 0010 |
| 30 db≤ x <40 db | 3 | 0011 |
| 40 db≤ x <50 db | 4 | 0100 |
| 50 db≤ x <60 db | 5 | 0101 |
| 60 db≤ x <70 db | 6 | 0110 |
| 70 db≤ x <80 db | 7 | 0111 |
| 80 db≤ x <90 db | 8 | 1000 |
| 90 db≤ x ≤100 db | 9 | 1001 |

The described analogue to digital converter, therefore, provides 10 quantization levels representing the input signal in 10's of db.'s above a reference level. Quantization in smaller steps may readily be accomplished by adding threshold detectors with intermediate settings and increasing the number of shift register and counter stages accordingly. Also, the range can be easily extended to 120 db. by: designing amplifier A4 to have a dynamic range of 60 db., adding another threshold detector at the output of amplifier A5, adding one or two threshold detectors at the output of amplifier A4, adding two or three stages to shift register 20, and adding another stage to counter 21. Further increases in range can be obtained by adding another parallel string of amplifiers with an attenuator. As previously mentioned, the number and size of the quantization increments can be changed by appropriate changes in amplifier gains and the number and settings of the threshold detectors. Thus, in addition to providing nonlinear or logarithmic (x db.) steps as in the described converter, the circuit can easily be designed to quantize the linear voltage increments. The minimum size of the increments depends on the design of the threshold detectors. Speed of operation is determined by the clock frequency and the operational speed capability of the flip-flop stages in the shift register and counter. Integrated circuits presently available make possible peak level sampling rates of 1.1 mc./sec. and higher.

While a particular embodiment of the invention has been illustrated, it is to be understood that the applicants do not wish to be limited thereto since modifications will now be suggested to ones skilled in the art. For example, the converter may include just one string of serially connected amplifiers, depending upon the capability required; linear rather than logarithmic amplifiers may be employed for linear quantization; the threshold detectors can have associated averaging or peak detection capabilities by using integrators or peak detectors at the inputs thereto; and, logic circuits other than shift register 20 may be employed to provide the serial to parallel conversion. Applicants, therefore contemplate by the appended claims to cover all such modifications as fall within the true spirit and scope of the invention.

We claim:

1. An analogue to digital converter comprising, an analogue signal input terminal, a first string of serially connected amplifiers, the input of the first amplifier in said first string being coupled to said analogue signal input terminal, a plurality of threshold detectors, the outputs of a plurality of the amplifiers in said first string each being coupled to the input of a respective one or more of said threshold detectors, a logic circuit having a plurality of input terminals and a pulse output terminal, the output of each threshold detector being coupled to a respective one of said logic circuit input terminals, and a digital counter connected to the output terminal of said logic circuit and operative in response to output pulses therefrom for producing a digital readout representative of the signal level at said analogue signal input terminal.

2. An analogue to digital converter in accordance with claim 1 wherein each of said first string amplifiers is a logarithmic amplifier, and wherein the number and settings of said threshold detectors and the gain and dynamic range of each of said string amplifiers are selected to provide a logarithmic quantization of the signal level applied at said analogue signal input terminal, the digital readout of said counter being representative of said logarithmic quantization of the input signal level.

3. An analogue to digital converter in accordance with claim 1 wherein said logic circuit comprises a shift register.

4. An analogue to digital converter in accordance with claim 1 further including a second string of serially connected amplifiers, the input of the first amplifier in said second string being coupled to said analogue signal input terminal, and the outputs of a plurality of the amplifiers in said second string each being coupled to the input of a respective one or more of said threshold detectors.

5. An analogue to digital converter in accordance with claim 4 wherein wherein said logic circuit comprises a shift register.

6. An analogue to digital converter in accordance with claim 5 wherein each of the amplifiers in said first and second strings is a logarithmic amplifier, and wherein the number and settings of said threshold detectors and the gain and dynamic range of each of the amplifiers in said first and second strings are selected to provide a logarithmic quantization of the signal level applied at said analogue signal input terminal, the digital readout of said counter being representative of said logarithmic quantization of the input signal level.

7. An analogue to digital converter in accordance with claim 6 further including means responsive to a command signal for inhibiting the outputs of said threshold detectors and applying shift pulses to said register.

8. An analogue to digital converter in accordance with claim 7 wherein each of said threshold detectors is operative when triggered to cause a corresponding stage of said shift register to be switched from a quiescent first binary state to a second binary state, each shift pulse applied to the register when its first stage is in the second binary state causes an output pulse to be generated from the register, said register means including an inverter connecting the output of its first stage to the input of its last stage, and said counter is a binary counter operative in response to output pulses from said shift register for producing a binary coded decimal readout which represents the peak signal level at said analogue signal input terminal during the time interval terminated by said command signal.

9. An analogue to digital converter in accordance with claim 8 wherein each of said threshold detectors comprises a Schmitt trigger circuit.